(12) United States Patent  (10) Patent No.: US 8,933,562 B2
Kinser et al.  (45) Date of Patent: Jan. 13, 2015

(54) IN-SITU THERMOELECTRIC COOLING

(71) Applicant: International Business Machines Corporation, Armonk, NY (US)

(72) Inventors: Emily Kinser, Poughkeepsie, NY (US); Mukta G. Farooq, Hopewell Junction, NY (US); JoAnn M. Rolick-DiGiacomio, Clinton Corners, NY (US); Charu Tejwani, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/748,821

(22) Filed: Jan. 24, 2013

(65) Prior Publication Data

US 2014/0203433 A1 Jul. 24, 2014

(51) Int. Cl.
*H01L 23/48* (2006.01)
*H01L 23/38* (2006.01)

(52) U.S. Cl.
CPC ........................................ *H01L 23/38* (2013.01)
USPC ........................................................ 257/738

(58) Field of Classification Search
CPC ............ H01L 2225/06541; H01L 2225/06589
USPC ........................................................ 257/738
See application file for complete search history.

(56) References Cited

U.S. PATENT DOCUMENTS

| | | | |
|---|---|---|---|
| 8,446,003 B2 * | 5/2013 | Komura et al. ............... | 257/700 |
| 2003/0113950 A1 | 6/2003 | Cooper et al. | |
| 2005/0150539 A1 | 7/2005 | Ghoshal et al. | |
| 2009/0273002 A1 * | 11/2009 | Chiou et al. ...................... | 257/99 |
| 2009/0294947 A1 * | 12/2009 | Tain et al. ...................... | 257/686 |
| 2010/0187683 A1 | 7/2010 | Bakir et al. | |
| 2010/0206737 A1 | 8/2010 | Preisser | |
| 2011/0042805 A1 | 2/2011 | Yu et al. | |
| 2011/0104846 A1 | 5/2011 | Hsu et al. | |
| 2011/0290295 A1 * | 12/2011 | Veerasamy ................... | 136/224 |
| 2012/0133051 A1 | 5/2012 | Knickerbocker et al. | |
| 2012/0162947 A1 | 6/2012 | O'Donnell et al. | |
| 2013/0343000 A1 * | 12/2013 | Shi et al. ....................... | 361/717 |

FOREIGN PATENT DOCUMENTS

| | | |
|---|---|---|
| CN | 101931044 A | 12/2010 |
| CN | 102347316 A | 2/2012 |
| KR | 1020120019536 A | 3/2012 |

OTHER PUBLICATIONS

Zhou, Fan et al.; Modeling Heat Transport in Thermal Interface Materials Enhanced With MEMS-Based Microinterconnects; IEEE Transactions on Components and Packaging Technologies, vol. 33, No. 1, Mar. 2010; pp. 16-24.

* cited by examiner

*Primary Examiner* — Ahmed Sefer
(74) *Attorney, Agent, or Firm* — Catherine Ivers; Howard M. Cohn

(57) ABSTRACT

Methods and structures for thermoelectric cooling of 3D semiconductor structures are disclosed. Thermoelectric vias (TEVs) to form a thermoelectric cooling structure. The TEVs are formed with an etch process similar to that used in forming electrically active through-silicon vias (TSVs). However, the etched cavities are filled with materials that exhibit the thermoelectric effect, instead of a conductive metal as with a traditional electrically active TSV. The thermoelectric materials are arranged such that when a voltage is applied to them, the thermoelectric cooling structure carries heat away from the interior of the structure from the junction where the thermoelectric materials are electrically connected.

14 Claims, 13 Drawing Sheets

IN-SITU THERMOELECTRIC COOLING

FIELD OF THE INVENTION

The present invention relates generally to semiconductor fabrication, and more particularly, to methods and structures for in-situ thermoelectric cooling.

BACKGROUND OF THE INVENTION

The packaging density in electronic industry continuously increases in order to accommodate more electronic devices into a package. In this regard, three-dimensional (3D) wafer-to-wafer stacking technology substantially contributes to the device integration process. Typically, a semiconductor wafer includes several layers of integrated circuitry (e.g., processors, programmable devices, memory devices, etc.) built on a silicon substrate, which are electrically connected using one or more wiring levels. A top layer of the wafer may be connected to a bottom layer of the wafer using interconnects or vias. In order to form a 3D wafer stack, two or more wafers are placed on top of one other and bonded, with the top and bottom wafers electrically connected using through silicon vias (TSVs). 3D stacking may also be achieved by stacking one or more individual known-good die, or chips. Chip-to-chip or chip-to-wafer stacking may be utilized to achieve 3D integration of ICs. As circuit density increases and power requirements continue to increase, heat generated during circuit operation can be a factor that adversely affects circuit reliability.

SUMMARY OF THE INVENTION

In one embodiment of the present invention, a semiconductor structure is provided. The semiconductor structure comprises a die comprised of a semiconductor material, the die including a top surface, a conductive region disposed within the die, a first thermoelectric via (TEV) originating from the top surface and terminating at the conductive region, a second TEV originating from the top surface and terminating at the conductive region, a first capture pad disposed on the top surface and connected to the first TEV, and a second capture pad disposed on the top surface and connected to the second TEV. In another embodiment of the present invention, a semiconductor structure is provided. The semiconductor structure comprises a first die, a second die disposed over the first die, a thermoelectric cooler structure comprising a conductive region disposed within the first die, a first thermoelectric via (TEV) extending from the conductive region, and traversing the second die, a second thermoelectric via (TEV) extending from the conductive region, and traversing the second die, a first capture pad connected to the first TEV, and a second capture pad connected to the second TEV.

In another embodiment of the present invention, a method of forming a cooling structure within a multilevel semiconductor structure is provided. The method comprises forming a conductive region within a first die of the multiple die semiconductor structure, forming a first thermoelectric via within the multiple die semiconductor structure, such that it terminates at the conductive region and wherein the first thermoelectric via traverses a second die of the multiple die semiconductor structure, forming a second thermoelectric via within the multiple die semiconductor structure, such that it terminates at the conductive region and wherein the second thermoelectric via traverses the second die of the multiple die semiconductor structure, forming a first capture pad connected to the first thermoelectric via, and forming a second capture pad connected to the second thermoelectric via.

In another embodiment of the present invention, a method of cooling a semiconductor structure is provided. The method comprises providing a first capture pad on a surface of the semiconductor structure, wherein the first capture pad is connected to a first thermoelectric via that is connected to a conductive region, providing a second capture pad on the surface of the semiconductor structure, wherein the second capture pad is connected to a second thermoelectric via that is connected to the conductive region, and applying a voltage between the first capture pad and the second capture pad.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Figure 1:
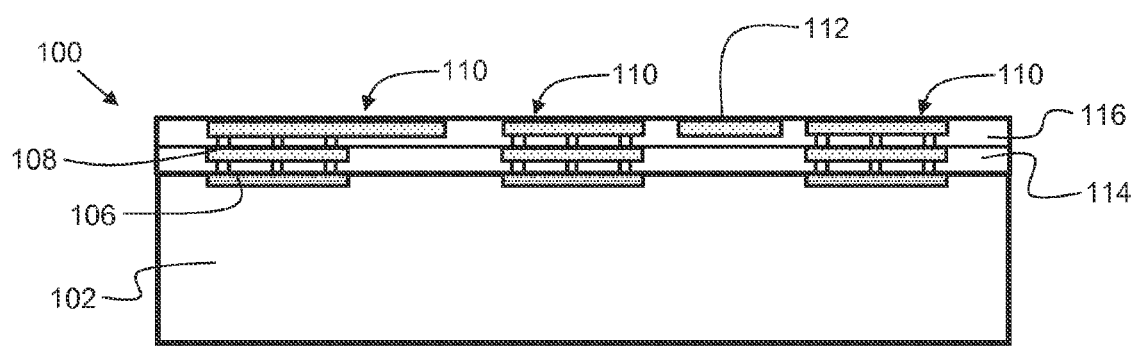

Similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a first wafer in accordance with an embodiment of the present invention.

Figure 2:
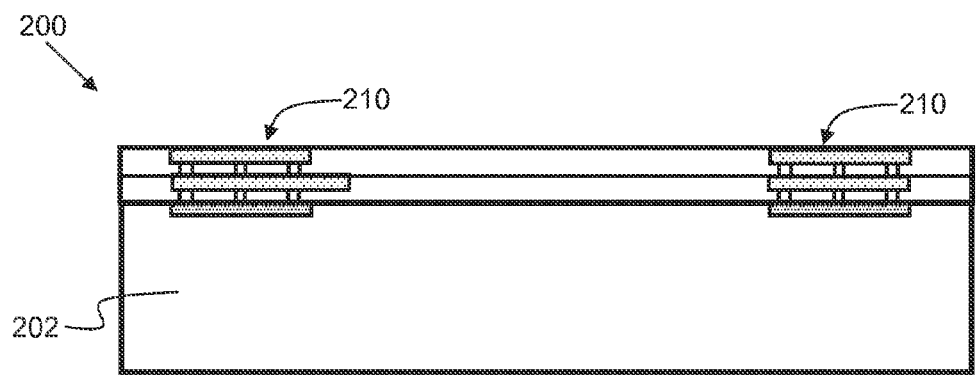

FIG. 2 is a second wafer used to form a multilevel structure in accordance with an embodiment of the present invention.

Figure 3:
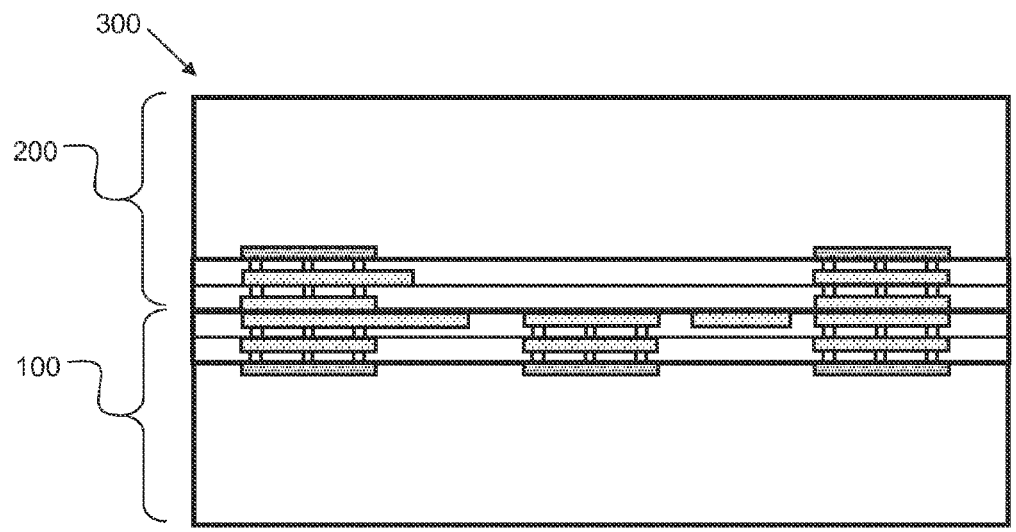

FIG. 3 is a multilevel structure comprised of the first and second wafer.

Figure 4:
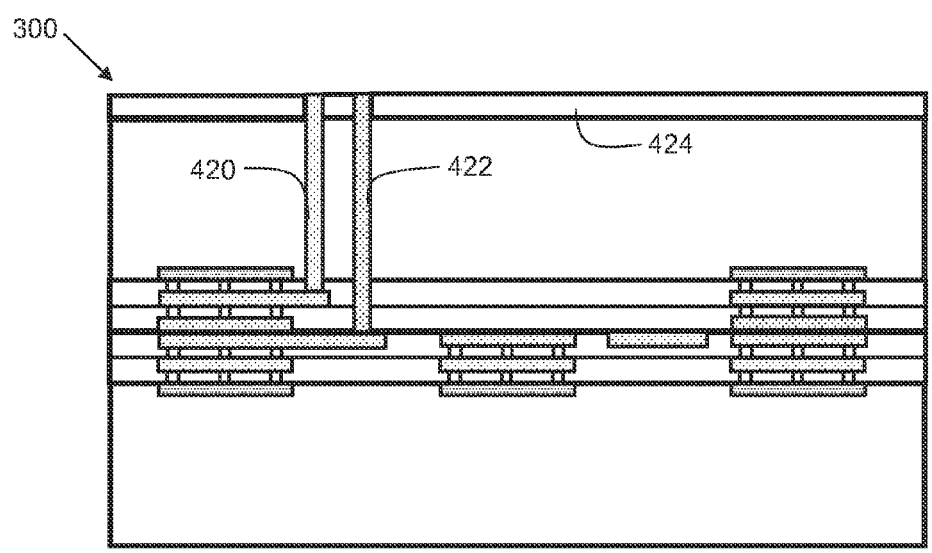

FIG. 4 shows the multilevel structure after a process step of forming through-silicon vias (TSVs).

Figure 5:
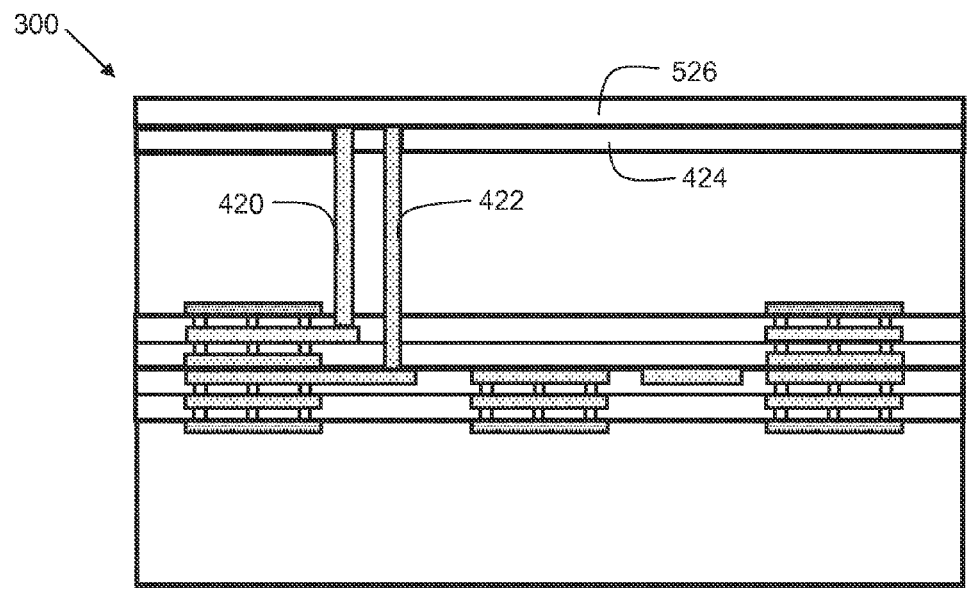

FIG. 5 shows the multilevel structure after a process step of depositing a first insulator layer.

Figure 6:
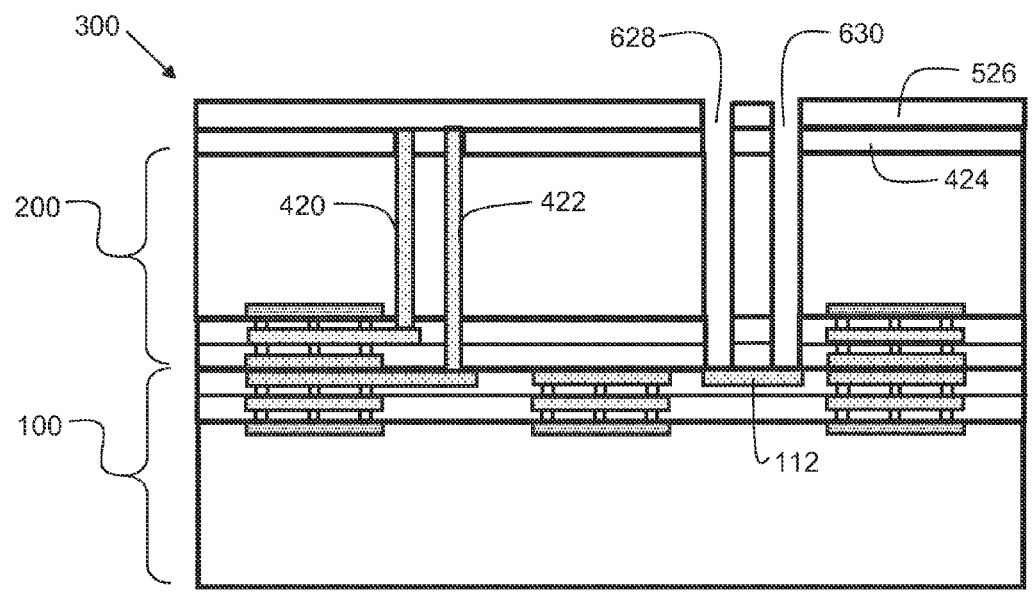

FIG. 6 shows the multilevel structure after a process step of forming cavities for thermoelectric vias (TEVs).

Figure 7:
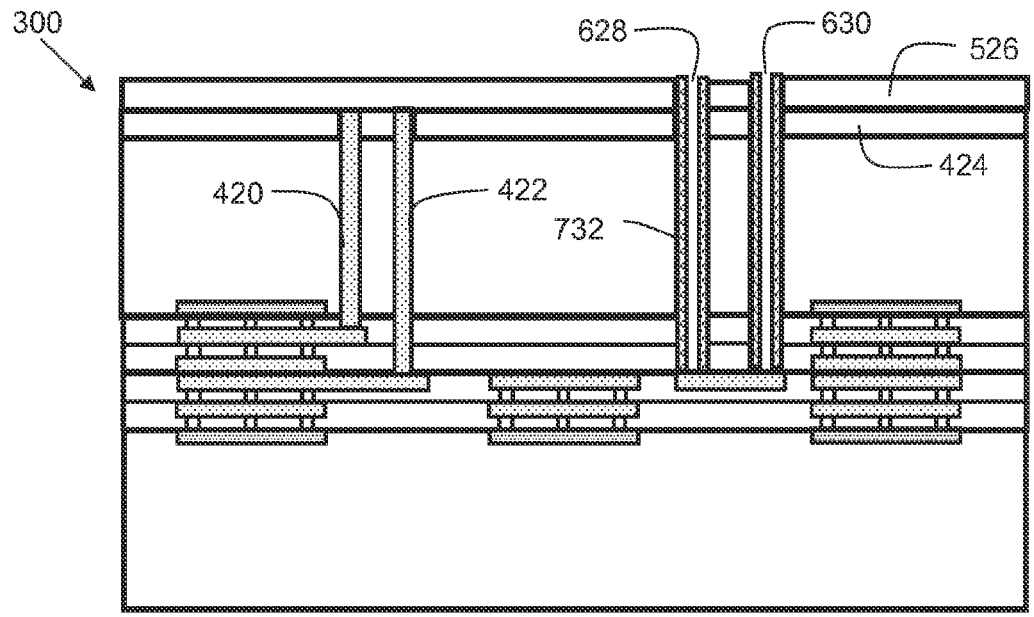

FIG. 7 shows the multilevel structure after a process step of lining the TEV cavities with a barrier layer.

Figure 8:
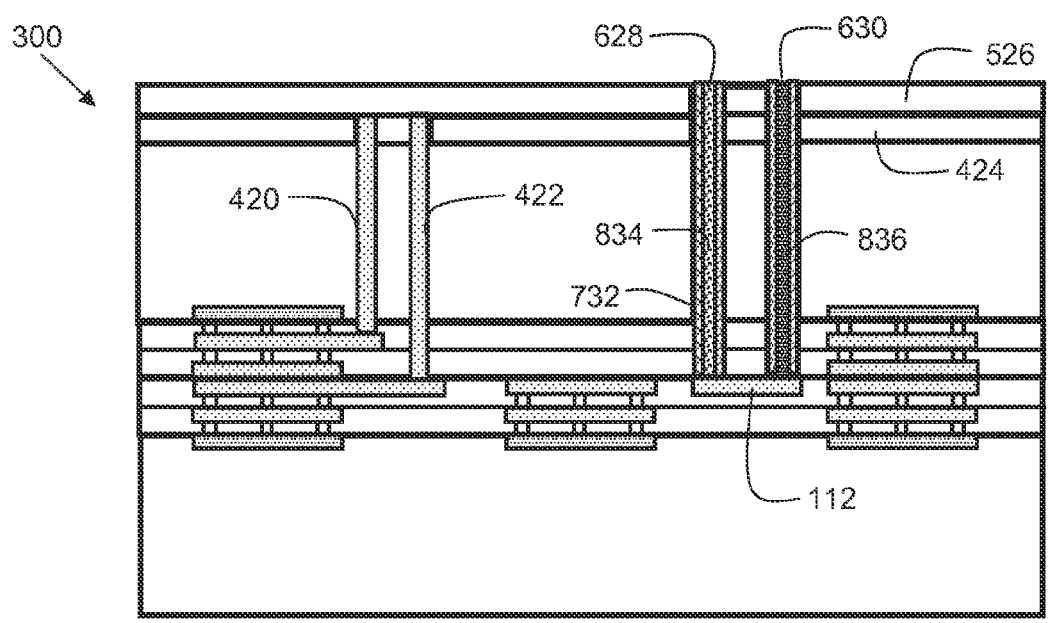

FIG. 8 shows the multilevel structure after a process step of filling the TEVs with thermoelectric materials.

Figure 8A:
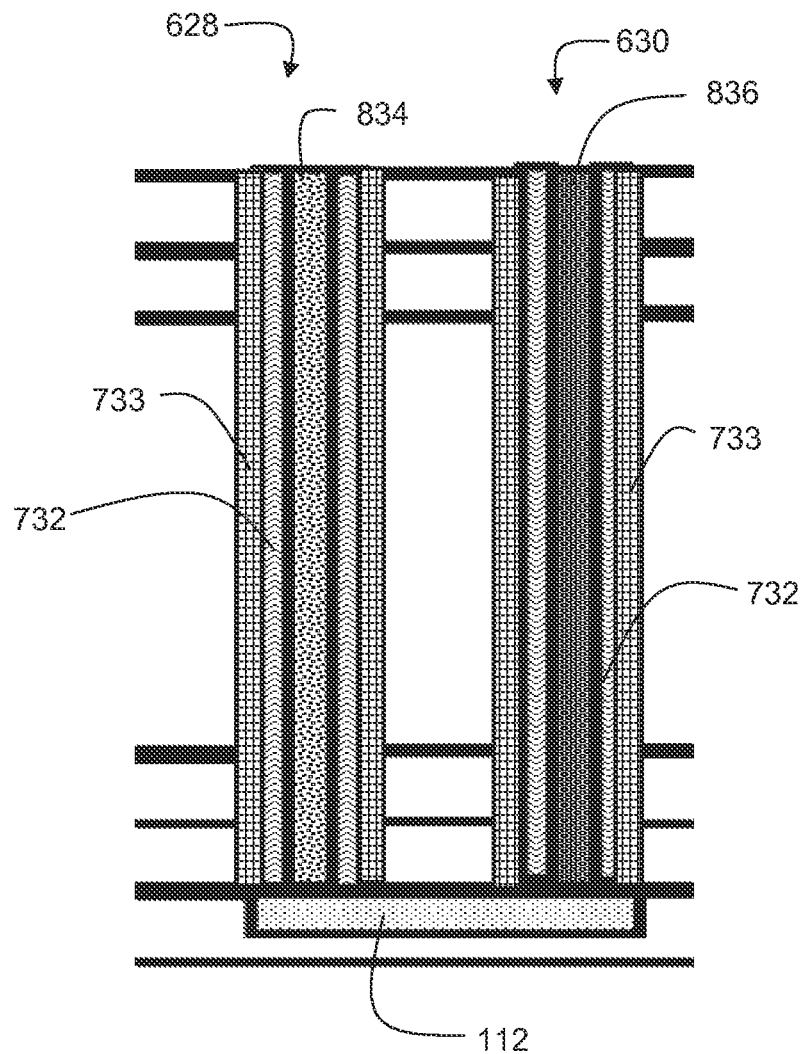

FIG. 8A shows details of the multilevel structure of FIG. 8.

Figure 9:
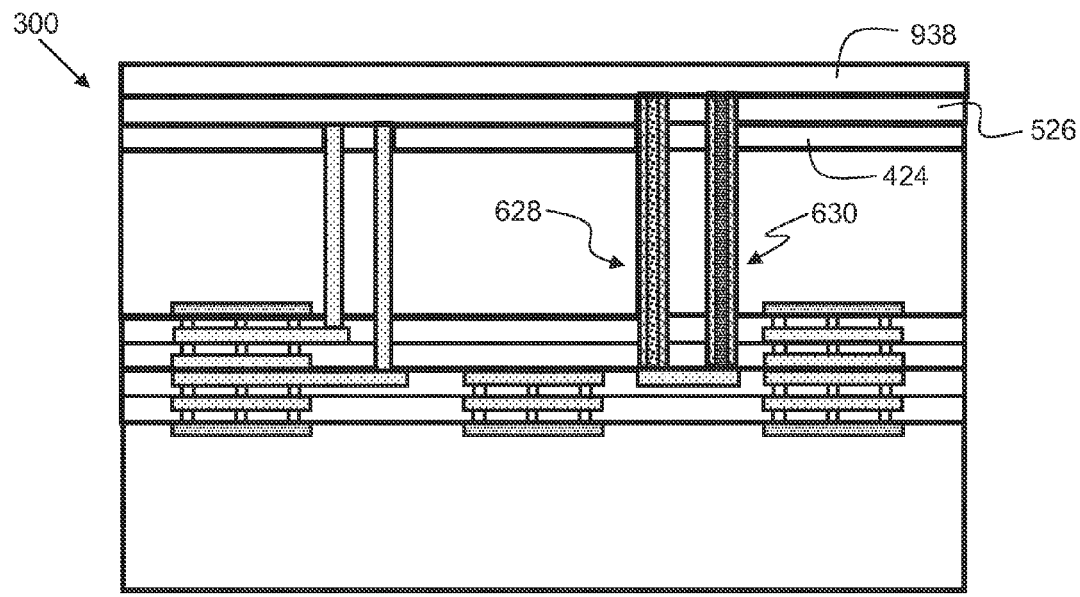

FIG. 9 shows the multilevel structure after a process step of depositing a second insulator layer.

Figure 10:
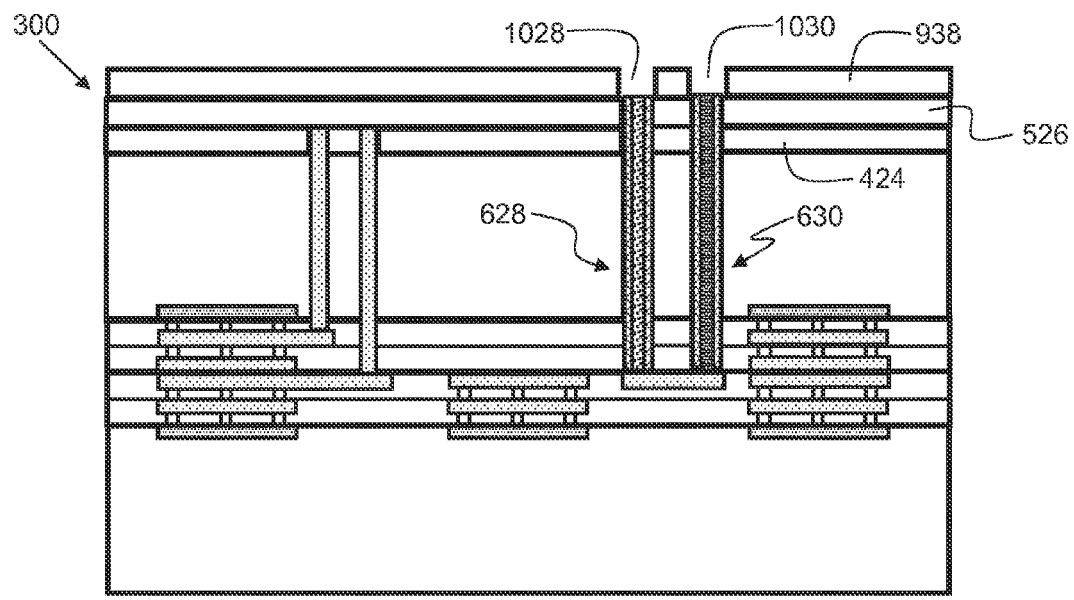

FIG. 10 shows the multilevel structure after a process step of opening the insulator over the TEVs.

Figure 11:
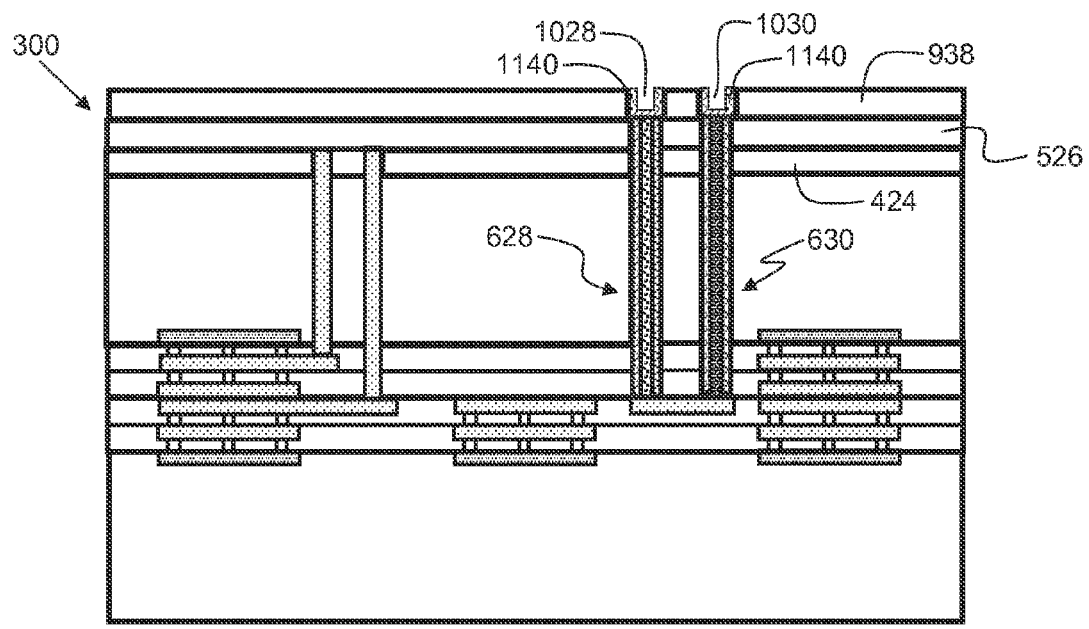

FIG. 11 shows the multilevel structure after a process step of sealing the TEVs with a barrier layer.

Figure 11A:
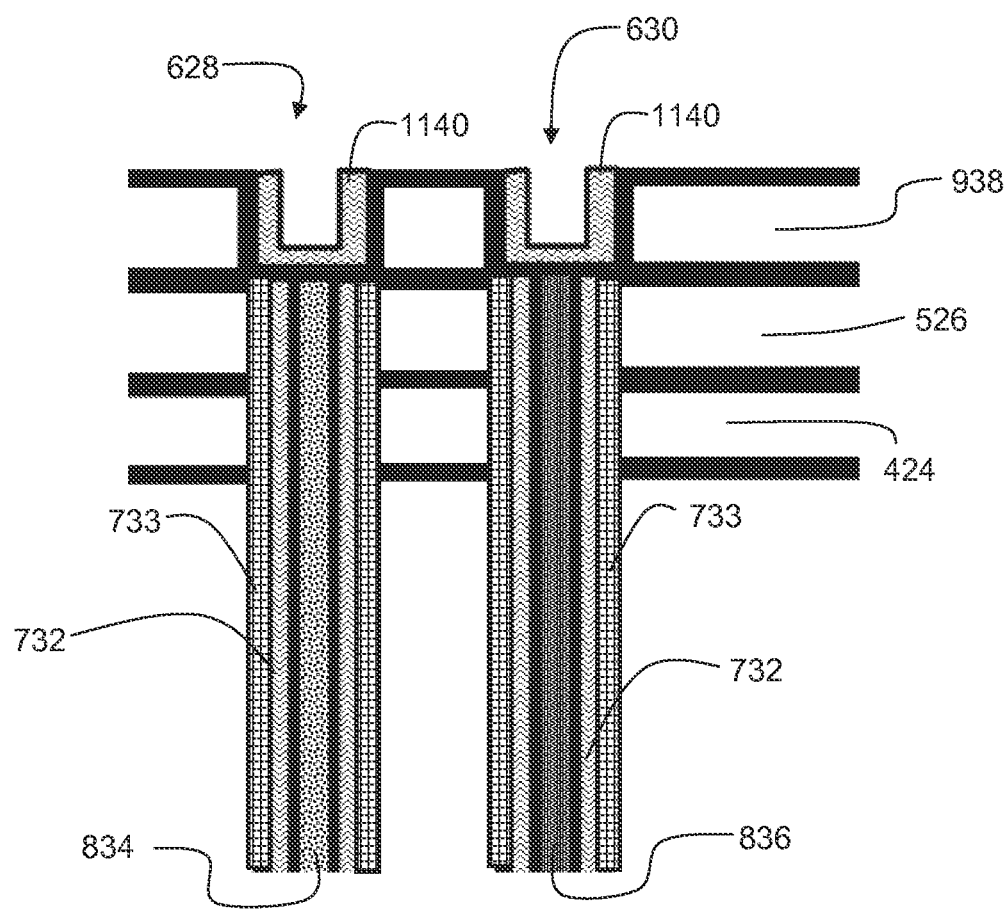

FIG. 11A shows details of the multilevel structure of FIG. 11.

Figure 12:
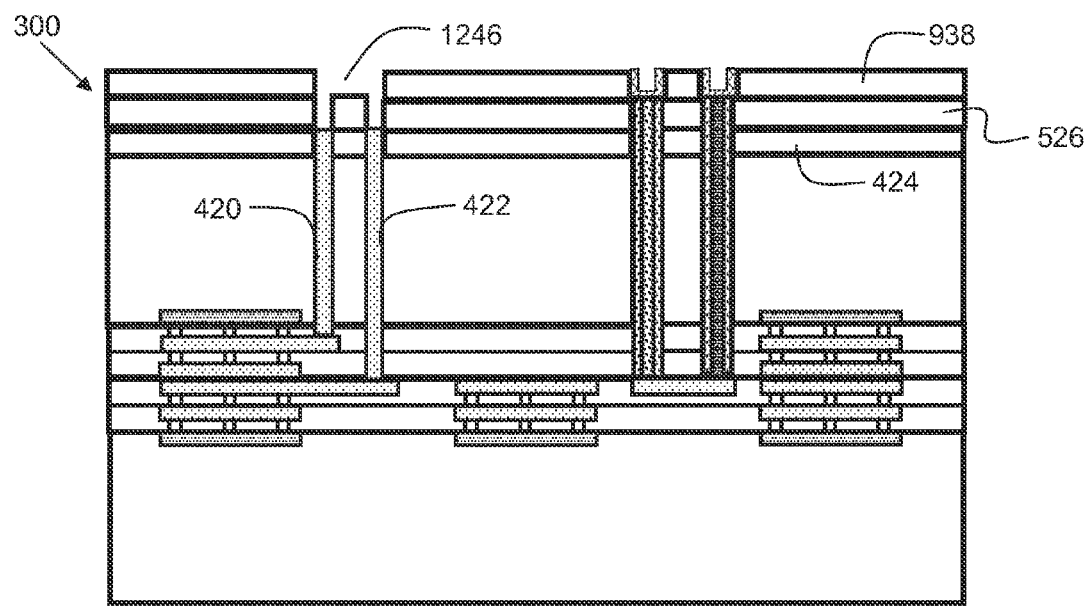

FIG. 12 shows the multilevel structure after a process step of opening the insulator over the TSVs.

Figure 13:
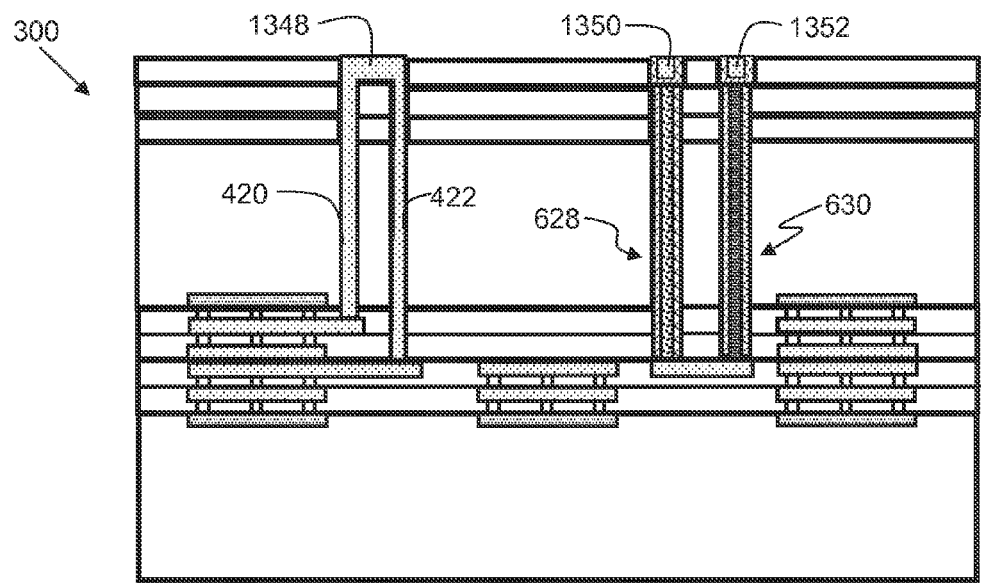

FIG. 13 shows the multilevel structure after a process step of completing the wiring of the TSVs.

Figure 14:
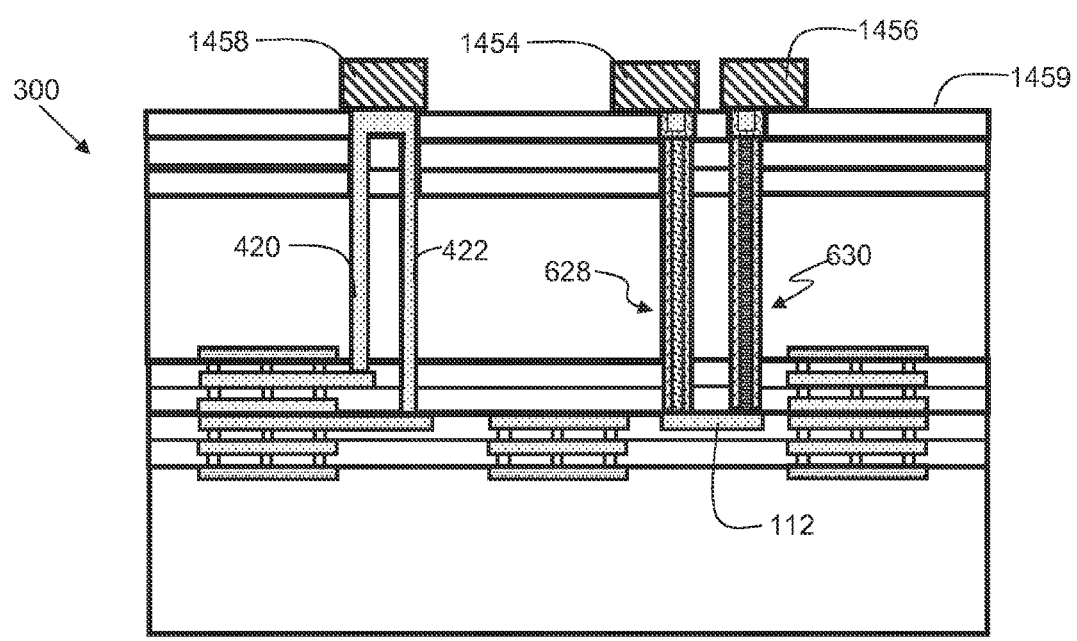

FIG. 14 shows a multilevel structure in accordance with an embodiment of the present invention.

Figure 15:
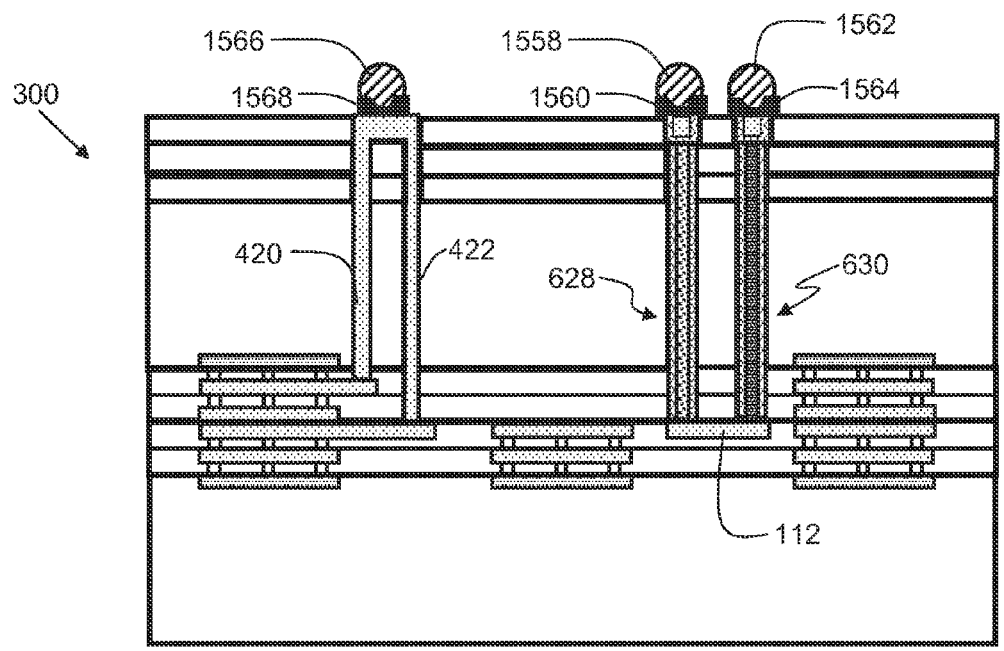

FIG. 15 shows a multilevel structure in accordance with another embodiment of the present invention.

Figure 16:
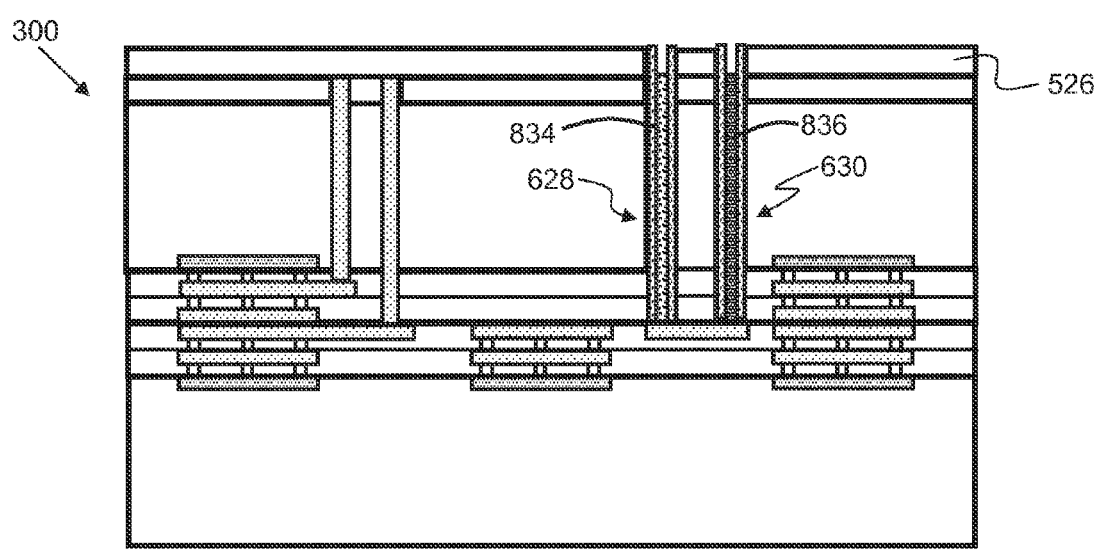

FIG. 16 shows a multilevel structure after a process step of under-filling TEVs in accordance with another embodiment of the present invention.

Figure 17:
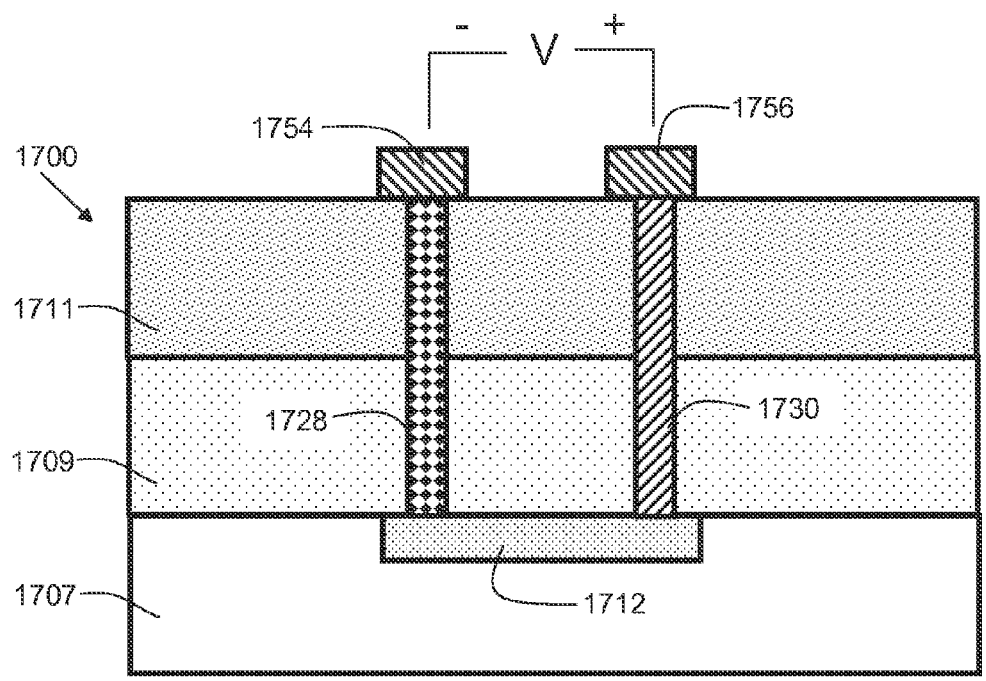

FIG. 17 shows a multilevel structure in accordance with another embodiment of the present invention.

Figure 17A:
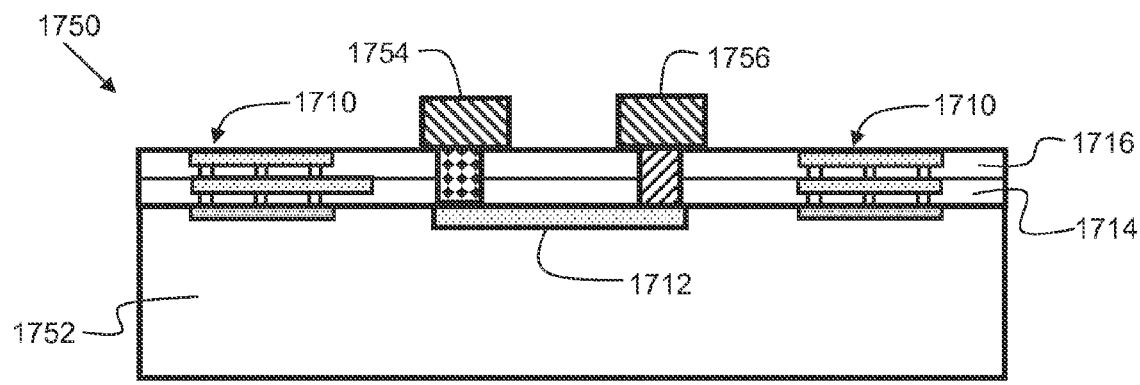

FIG. 17A shows a multilevel structure in accordance with another embodiment of the present invention.

Figure 18:
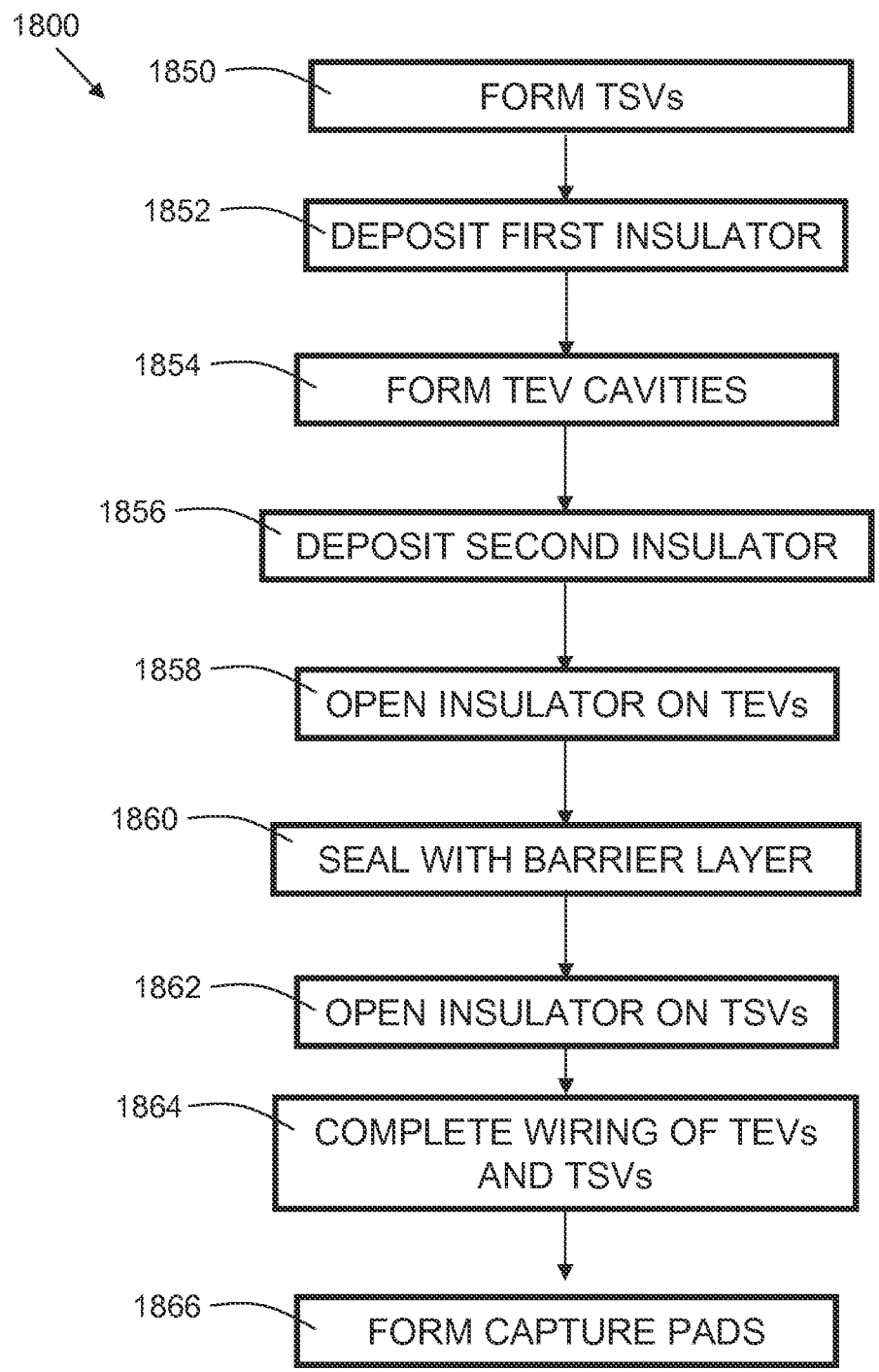

FIG. 18 is a flowchart indicating process steps for an embodiment of the present invention.

Figure 19:
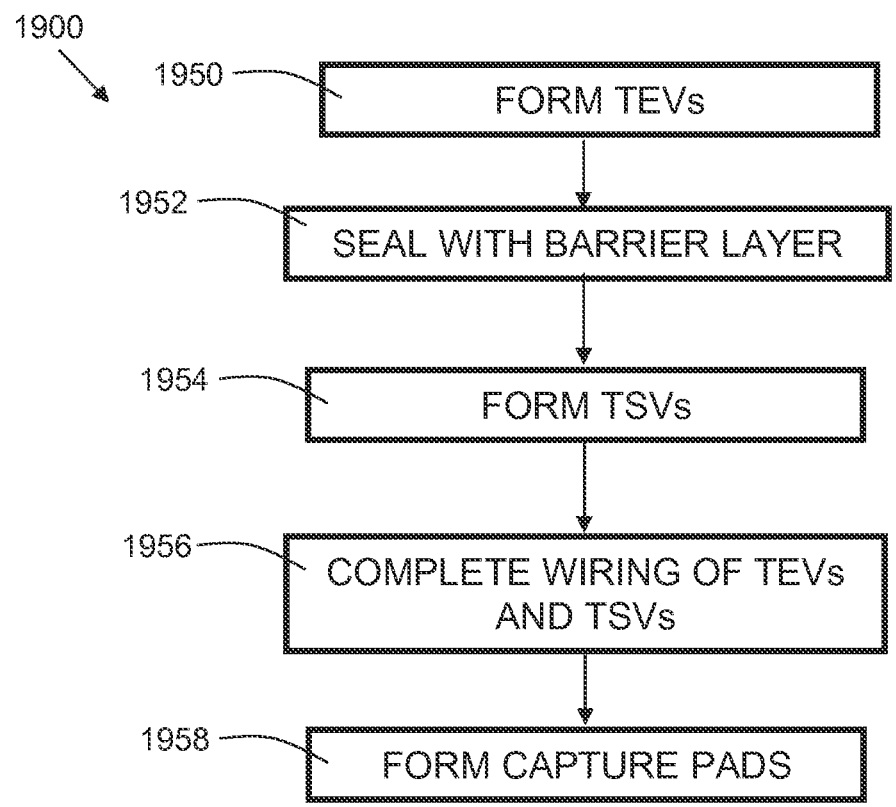

FIG. 19 is a flowchart indicating process steps for an alternative embodiment of the present invention.

DETAILED DESCRIPTION

Exemplary embodiments will now be described more fully herein with reference to the accompanying drawings, in which exemplary embodiments are shown. Exemplary embodiments of the invention provide approaches for a thermoelectric cooling structure which may be formed along with other electrically active through-silicon vials (TSVs).

Embodiments of the present invention are well-suited to multilevel (3D) structures. Methods in accordance with embodiments of the present invention may be practiced on individual chips or die, or wafers, which typically contain many die. Embodiments of the present invention use thermoelectric vias (TEVs) to form a thermoelectric cooling structure. TEVs may be formed with an etch process similar to that used in forming TSVs. However, the etched cavities are filled with materials that exhibit the thermoelectric effect, hereinafter referred to as thermoelectric materials, instead of a conductive metal as with a traditional electrically active TSV. The thermoelectric materials are arranged such that when a voltage is applied to them, the thermoelectric cooling structure carries heat away from the interior of the structure from the junction where the thermoelectric materials are electrically connected. This allows heat to be removed from areas of the 3D structure which do not have exposed surface area, which can improve circuit reliability. Furthermore, embodiments of the present invention remove heat without the additional cost and complexity associated with microfluidics.

It will also be understood that when an element as a layer, region, substrate, or wafer is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In accordance with an embodiment of the present invention, FIG. 1 depicts the cross-sectional view of a first wafer 100, which is to be integrated and bonded with one or more additional wafers. Note that in this disclosure, the term "wafer" may refer to a structure containing multiple die. The wafer 100 comprises a semiconductor substrate 102. Substrate 102 may be a bulk silicon substrate, or in other embodiments, may be a silicon-on-insulator (SOI) substrate with a thin silicon layer on a buried oxide (BOX) layer which is disposed on a bulk silicon substrate, or other suitable material, such as silicon germanium, germanium, gallium arsenide, or other materials known in the art. In one particularly useful embodiment, substrate 102 is composed of silicon.

In the exemplary embodiment depicted, the wafer 100 represents a wafer having front-end-of line (FEOL), middle-of-the-line (MOL), and back-end-of-line (BEOL) structures formed thereon, as known in the art. A plurality of integrated circuit structures 110, representing FEOL structures and associated processing, are formed within the semiconductor substrate. Each circuit structure 110 comprises an active circuit 106, which may comprise a plurality of transistors, resistors, capacitors, and other circuit elements.

The MOL and BEOL of wafer 100 may contain one or more wiring levels (114 and 116), which are illustrative only. In an actual device, several layers of dielectric materials (not shown) may contain wiring composed of conductive material (shown generally as 108) to electrically connect the active circuits to other active circuits formed within the same die. Conductive region 112 serves as the base of a thermoelectric cooling structure. As with conductive wiring layer 108, conductive region 112 may be a metal region, and in a preferred embodiment conductive region 112 may be comprised of copper. Conductive region 112 may be formed concurrently with the associated wiring layers, but conductive region 112 is not electrically connected with any BEOL levels or active circuits within wafer 100.

FIG. 2 depicts a cross-sectional view of a second wafer 200, which is to be integrated and bonded to first wafer 100 shown in FIG. 1 to form a multilevel 3D structure in accordance with an embodiment of the present invention. As with wafer 100, wafer 200 represents a wafer having front-end-of line (FEOL), middle-of-the-line (MOL), and back-end-of-line (BEOL) structures formed thereon, as known in the art. Wafer 200 comprises a plurality of circuit structures 210. As stated previously, similar elements may be referred to by similar numbers in various figures (FIGs) of the drawing, in which case typically the last two significant digits may be the same, the most significant digit being the number of the drawing figure (FIG). For example, semiconductor substrate 202 of FIG. 2 is similar to semiconductor substrate 102 of FIG. 1. Similarly, wafer 200 also contains MOL and BEOL layers similar to wafer 100, which are depicted for illustrative purposes.

FIG. 3 illustrates a multilevel structure 300 comprised of the first wafer 100 and second wafer 200, in which both wafers are bonded together to form an integrated 3D multilevel structure 300. Second wafer 200 is flipped and placed on first wafer 100. The first wafer 100 and second wafer 200 may be bonded together via industry-standard processes. This may include forming additional bonding on one or both of the wafers (not shown). The bonding layer compositions may vary by bonding method to be utilized, including but not limited to metal-metal bonding, dielectric-dielectric bonding, adhesive bonding, or other bonding methods and materials known in the art. In a preferred embodiment, dielectric layers comprising silicon oxide may be formed on the top exposed surface of each wafer, and fusion bonding of the dielectric layers is utilized. Also, although it is not depicted in the illustration, it is understood by those skilled in the art that one or both exposed surfaces of substrates 102 and 202 of the multilevel wafer structure 300 may be thinned using methods known in the art.

FIG. 4 depicts multilevel structure 300 after a process step of depositing a dielectric layer 424 on the structure, followed by the formation of through-silicon vias (TSVs) 420 and 422. Subsequent to bonding, a dielectric layer 424 is deposited on the top exposed surface of multilevel structure 300. In a preferred embodiment, dielectric layer 424 may comprise a silicon oxide layer. The dielectric layer 424 may actually comprise more than one dielectric material combined into a single layer. In another preferred embodiment, layer 424 may comprise a silicon nitride cap layer followed by the deposition of a silicon oxide layer.

The TSVs 420 and 422 may be formed using processes known in the art, including by performing photolithography followed by a deep reactive ion etch (DRIE), or Bosch etch, to form cavities which are then lined with a dielectric isolation layer followed by a subsequent diffusion barrier layer deposition, and then filled with a conductive material, such as copper. Any overburden of conductive material may then be removed, using a process which may include chemical mechanical planarization (CMP). Additionally, a capping layer such a silicon nitride layer (not illustrated) may be deposited to prevent oxidation or contamination of the exposed conductive and dielectric materials during subsequent processing. Although for purposes of illustration TSVs 420 and 422 are depicted as two individual TSVs to illustrate individual electrical connections to both the bottom and top wafers 100 and 200, respectively, it is to be understood by those in the art that a single TSV could be used to electrically connect two integrated circuits that existed in wafer 100 and 200, if desired.

After completion of all required processes associated with TSV formation, a first dielectric layer 526 is deposited on the exposed top surface of multilevel structure 300, as depicted in FIG. 5. Dielectric layer 526 may comprise a silicon oxide layer. The dielectric layer 526 may actually comprise more than one dielectric material combined into a single layer. In another preferred embodiment, layer 526 may comprise a silicon nitride cap layer followed by the deposition of a silicon oxide layer. The first dielectric layer 526 covers the TSVs 420 and 422.

FIG. 6 shows a multilevel structure 300 after a process step of forming cavities 628 and 630 for thermoelectric vias (TEVs). The cavities may be formed using processes known in the art, including by performing photolithography followed by performing a deep reactive ion etch (DRIE), or Bosch etch. The etch process continues until the depth of the TEV cavities 628 and 630 extends through the entire portion of wafer 200, including the substrate, FEOL, MOL, & BEOL levels, and terminates when both via cavities 628 and 630 expose portions of conductive region 112 in wafer 100.

After formation and any subsequent cleaning of the TEV cavities, a dielectric isolation and barrier layer is deposited on the sidewalls of TEV cavities 628 and 630. FIG. 7 shows multilevel structure 300 after a process step of lining the TEV cavities with dielectric isolation and barrier layer 732. The barrier layer 732 serves to electrically isolate the conductive fill material which will be deposited subsequently in the TEV cavities 628 and 630 (see FIG. 6) from the semiconducting bulk substrate associated with wafer 200, as well as to prevent diffusion and promote adhesion of the fill materials. Barrier layer 732 may actually comprise more than one material combined into a single layer, including the deposition of a dielectric isolation layer followed by the deposition of a barrier layer 732. In some embodiments, the barrier layer 732 may comprise a composite structure including a first deposition of silicon dioxide combined with a diffusion barrier layer comprising tantalum and/or tantalum nitride (TaN). In a preferred embodiment, barrier layer 732 will be completely removed from the bottom of TEV cavities 628 and 630 (FIG. 6) but remain intact on the sidewalls of the TEVs.

FIG. 8 shows multilevel structure 300 after a process step of filling the TEVs with thermoelectric materials. TEV 628 is filled with a first type of thermoelectric material (n-type or p-type), and TEV 630 is filled with a complementary thermoelectric material (p-type or n-type). In one embodiment, TEV 628 is filled with $Bi_2Te_3$ and TEV 630 is filled with $Bi_2Se_3$. In another embodiment, lead telluride (PbTe) and $PbTe_{1-x}Se_x$ are used as the thermoelectric fill materials. Other thermoelectric materials may be used without departing from the scope of embodiments of the present invention.

FIG. 8A shows details of the multilevel structure of FIG. 8. In this view, it is seen that first TEV cavity 628 is lined with barrier layer 732 and dielectric layer 733, and filled with first thermoelectric material 834, and second TEV cavity 630 is lined with barrier layer 732 and dielectric layer 733, and filled with second thermoelectric material 836. TEVs 628 and 630 physically and electrically contact conductive region 112, traversing the second die (see 200 of FIG. 3). Conductive region 112 may be comprised of metal such as copper, and serves to conduct current, and, due to the thermoelectric effect, also remove heat from metal region 112 as well once current is applied.

Preventing cross contamination of standard semiconductor fabrication processing tools with the thermoelectric materials is beneficial to avoid the practical need of tool dedication and associated additional capital expenditure to enable the in-situ incorporation of TEVs with 3D multilevel IC structures. In order to mitigate the risk of contamination, a protective metal cap is formed over the top of the TEVs to fully encapsulate the thermoelectric materials. FIGS. 9 through 16 illustrate this process.

FIG. 9 shows a multilevel structure 300 after a process step of depositing a second dielectric layer 938 over the structure. Second dielectric 938 may comprise an oxide layer. Dielectric layer 938 may comprise a silicon oxide layer. The dielectric layer 938 may actually include more than one dielectric material combined into a single layer. In another preferred embodiment, layer 938 may comprise a silicon nitride cap layer followed by the deposition of a silicon oxide layer. The second dielectric layer 938 covers the top of TEV 628 and TEV 630.

As illustrated in FIG. 10, openings 1028 and 1030 are formed over the TEVs in dielectric layer 938 on top of multilevel structure 300. The openings may be formed using industry-standard techniques known in the art, such as photolithography and reactive ion etch (RIE) of the dielectric material to expose the top portion of TEV 628 and TEV 630. The same photomask may be used to form opening 1028 and 1030 as was used to pattern TEV cavities 628 and 630.

After the top portions of TEVs 628 and 630 are exposed, it is then possible to complete the encapsulation of the TEVs. FIG. 11 shows multilevel structure 300 after a process step of sealing the TEVs 628 and 630 with a barrier layer 1140. Barrier layer 1140 is formed by depositing a blanket film of the desired diffusion barrier material, which will deposit on both the top exposed surface of multilevel structure 300 as well as on the bottom and sidewalls of openings 1028 and 1030. Following the deposition of barrier layer 1140, a CMP operation is performed such that all of barrier layer 1140 existing on the top exposed surface of multilevel structure 300 is removed. Due to the difference in the height of openings 1028 and 1030, the barrier layer 1140 will remain intact on the sidewalls and the bottoms of the aforementioned openings, therefore completely encapsulating the TEVs, so that the only exposed materials are those which are known in standard semiconductor fabrication.

The final sealed TEV structure is shown in further detail in FIG. 11A. TEVs 628 and 630 are sealed by barrier layer 1140, thus encapsulating thermoelectric materials 834 and 836. Barrier layer 1140 may be comprised of the same material as the barrier layer used for the TEV sidewalls and may include a barrier layer 732 and possibly a dielectric layer 733, similar to as described for FIG. 8A. In a preferred embodiment, barrier layer 1140 comprises tantalum and/or tantalum nitride.

The sealing of the TEVs (628 and 630) can be beneficial for the manufacturing process as it helps to contain the thermoelectric materials and avoid contamination with other tools used in the fabrication process. By sealing the TEVs, it allows the TEVs to be filled in one facility, and then the wafers, with sealed TEVs, are transferred to another facility for continued processing to completion. Since the TEVs are sealed by the barrier layer (1140 of FIG. 11A), the thermoelectric materials in the TEVs do not escape from the TEVs and contaminate anything else during the remainder of the fabrication process.

After completing encapsulation of the TEVs, final wiring and termination levels for both the standard electrical TSVs and the TEVs can be formed, ideally using the same process steps and tools. FIGS. 12 through 15 illustrate the formation of final wiring and termination. FIG. 12 shows a multilevel structure 300 after a process step of forming an opening 1246 in the dielectric layers 526 and 1028 over the electrical TSVs 420 and 422. This may be done through industry-standard techniques involving patterning techniques including photolithography to pattern opening 1246 in photoresist (not shown) and then using a reactive ion etch (RIE) process to etch second insulator 938 and first insulator 526 to form the openings. One or more patterning sequences may be required to form opening 1246.

FIG. 13 shows a multilevel structure 300 after a process step of completing the wiring of the TSVs, in which the openings formed about the TSVs and TEVs are filled with a conductive material, such as copper. Any overburden of conductive material may then be removed, using a process which may include chemical mechanical planarization (CMP). In this example, conductive segment 1348 is formed, joining TSV 420 to TSV 422. Conductive segments 1350 and 1352 are concurrently formed on the top of TEVs 628 and TEV 630 respectively. Additionally, a dielectric capping layer such as a silicon nitride layer (not illustrated) may be deposited to prevent oxidation or contamination of the exposed conductive and dielectric materials during subsequent processing.

FIG. 14 shows a multilevel structure 300 in accordance with an embodiment of the present invention. Capture pad 1454 is formed over, and connected to, TEV 628. Capture pad 1456 is formed over, and connected to, TEV 630. Concurrently, a single capture pad 1458 is formed over the electrical TSVs 420 and 422. In one embodiment, the capture pads 1454, 1456, and 1458 are comprised of aluminum. The TEVs 628 and 630 originate from the top surface 1459 of structure 300 and traverse the second die (see 200 of FIG. 3) and terminate at conductive metal region 112. When a voltage is applied between capture pad 1454 and capture pad 1456, the thermoelectric effect causes heat from metal region 112, which is deep within structure 300, to be transferred to the capture pads 1454 and 1456 on the top surface. Hence, heat is efficiently removed from multilevel structure 300. The heat removal is completely independent of any operation of the electrical circuit associated with the devices connected to capture pad 1458.

FIG. 15 shows an alternate termination structure associated with the multilevel structure 300 in accordance with another embodiment of the present invention. This embodiment is similar to multilevel structure 300 of FIG. 14, except that the TEVs (628 and 630) are terminated by solder balls 1558 and 1562, respectively. Solder ball 1558 is disposed on a ball-limiting metallurgy (BLM) structure 1560. Solder ball 1562 is disposed on a ball-limiting metallurgy (BLM) structure 1564. Concurrently, a solder ball 1566 is formed on ball-limiting metallurgy (BLM) structure 1568, which provides access to electrical TSVs 420 and 422.

Additional embodiments of the present invention exist, as illustrated in FIGS. 16 and 17. FIG. 16 shows a multilevel structure 300 in an alternative method of fabrication. In this embodiment, the TEVs 628 and 630 are under-filled using a bottom-up deposition technique to deposit the thermoelectric materials in the TEV etched cavities. The TEVs 628 and 630 are filled to a level below the top surface of insulator layer 526. From this point forward, the fabrication process is similar to the previously described process. The TEVs are sealed with a barrier layer (similar to what is shown in FIG. 11A). Capture pads are formed and the TSV wiring is completed, similar to the previously described process. This embodiment has an advantage in that the step of depositing the second insulator layer and CMP of the thermoelectric overburden (see 938 of FIG. 9) are eliminated.

FIG. 17 shows a multiple die structure 1700 in accordance with another embodiment of the present invention. Multiple die structure 1700 is comprised of three die (1707, 1709, and 1711) stacked on top of each other. Conductive region 1712 is formed in the first die and serves as the base of a thermoelectric cooling structure in accordance with an embodiment of the present invention. A first TEV 1728 is formed, extending from the conductive region 1712 and traversing the second die 1709 and the third die 1711, and is terminated at the top by capture pad 1754. A second TEV 1730 is formed, extending from the conductive region 1712 and traversing the second wafer 1709 and the third die 1711, and is terminated at the top by capture pad 1756. This process may be repeated as needed. Thus, it is possible to have a cooling structure with TEVs that extend through more than three die (or wafers). Conversely, some embodiments of the present invention may utilize only one die, and hence, are single die semiconductor structures. The heat generated by circuits near to conductive region 1712 is transferred to a capture pad (1754 or 1756) when a voltage V is applied between capture pad 1754 and capture pad 1756. In some embodiments, the voltage V is in the range of −1 volt to +1 volt.

FIG. 17A shows a single die semiconductor structure 1750. Semiconductor structure 1750 comprises a single die 1752. A conductive region 1712 is formed on the single die 1707. In some embodiments, conductive region 1712 may be formed at one of the wiring levels formed on the die. Thermoelectric vias 1758 and 1760 are formed in the structure 1750 and are connected to conductive region 1712 at one end, and to capture pads (1754, 1756) at the other end. Structure 1750 may comprise one or more wiring levels (1714 and 1716), which are illustrative only. In an actual device, several layers of dielectric materials (not shown) may contain wiring composed of conductive material to electrically connect the active circuits 1710 to other active circuits formed within the same die. This embodiment provides the advantages of avoiding the need for complex cooling systems such as microfluidic systems.

FIG. 18 is a flowchart 1800 indicating process steps for an embodiment of the present invention. In process step 1850, TSVs are formed (see 420 of FIG. 4). In process step 1852, a first insulator is deposited (see 526 of FIG. 5). In process step 1854, TEVs are formed (see FIG. 6-FIG. 8A). In process step 1856, a second insulator is deposited (see 938 of FIG. 9). In process step 1858, the second insulator layer is opened over the TEVs (see 1028 and 1030 of FIG. 10). In process step 1860, the TEVs are sealed with a barrier layer (see 1140 of FIG. 11A). In process step 1862, the insulator layers are opened over the TSVs (see 1246 of FIG. 12). In process step 1864, the wiring of the TSVs is completed (see 1348 of FIG. 13). In process step 1866, capture pads are formed (see 1454, 1456, and 1458 of FIG. 14).

FIG. 19 is a flowchart 1900 indicating high-level process steps for an alternative embodiment of the present invention. The process is similar to that described in flowchart 1800, except that the flowchart 1900 shows a process in which the TEVs are formed first in process step 1950 (as compared to forming the TSVs first in flowchart 1800). The TEVs are sealed with a barrier layer in process step 1952. In process step 1954, electrically active TSVs are formed. In process step 1956, the wiring of the TEVs and TSVs is completed. In process step 1966, capture pads are formed.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
 a die comprised of a semiconductor material, and comprising a back-end-of-line wiring structure formed thereon;
 a conductive region disposed within the die;
 a first thermoelectric via (TEV) originating from a top surface of the semiconductor structure and terminating at the conductive region;
 a second TEV originating from the top surface and terminating at the conductive region, wherein the first TEV and second TEV are disposed within the back-end-of-line wiring structure;
 a first capture pad disposed on the top surface and connected to the first TEV; and
 a second capture pad disposed on the top surface and connected to the second TEV.

2. The semiconductor structure of claim 1, wherein the conductive region is comprised of copper.

3. The semiconductor structure of claim 1, wherein the first TEV is filled with an n-type thermoelectric material comprising $Bi_2Te_3$.

4. The semiconductor structure of claim 1, wherein the second TEV is filled with a p-type thermoelectric material comprising $Bi_2Se_3$.

5. The semiconductor structure of claim 1, wherein the first TEV and second TEV are each lined with a barrier layer selected from the group consisting of tantalum and tantalum nitride.

6. The semiconductor structure of claim 1, wherein the first capture pad and second capture pad are comprised of aluminum.

7. The semiconductor structure of claim 1, wherein the first capture pad and second capture pad are comprised of a solder ball disposed on a ball-limiting-metallurgy structure.

8. A semiconductor structure comprising:
 a first die, comprising a first back-end-of-line wiring structure formed thereon;
 a second die disposed over the first die, the second die comprising a second back-end-of-line wiring structure formed thereon;
 a thermoelectric cooler structure comprising:
 a conductive region disposed within the first die;
 a first thermoelectric via (TEV) extending from the conductive region, and traversing the second die, first back-end-of-line wiring structure, and second back-end-of-line wiring structure;
 a second thermoelectric via (TEV) extending from the conductive region, and traversing the second die, first back-end-of-line wiring structure, and second back-end-of-line wiring structure;
 a first capture pad disposed on the second die, and connected to the first TEV; and
 a second capture pad disposed on the second die, and connected to the second TEV.

9. The semiconductor structure of claim 8, wherein the conductive region is comprised of copper.

10. The semiconductor structure of claim 8, wherein the first TEV is filled with an n-type thermoelectric material comprising $Bi_2Te_3$.

11. The semiconductor structure of claim 8, wherein the second TEV is filled with a p-type thermoelectric material comprising $Bi_2Se_3$.

12. The semiconductor structure of claim 8, wherein the first capture pad and second capture pad are comprised of aluminum.

13. The semiconductor structure of claim 8, wherein the first capture pad and second capture pad are comprised of a solder ball disposed on a ball-limiting-metallurgy structure.

14. The semiconductor structure of claim 8, further comprising a third die, the third die disposed on the second die, and wherein the first TEV and the second TEV traverse the third die.

* * * * *